United States Patent [19]
Chang et al.

[11] Patent Number: 5,266,819
[45] Date of Patent: Nov. 30, 1993

[54] SELF-ALIGNED GALLIUM ARSENIDE/ALUMINUM GALLIUM ARSENIDE COLLECTOR-UP HETEROJUNCTION BIPOLAR TRANSISTORS CAPABLE OF MICROWAVE APPLICATIONS AND METHOD

[75] Inventors: Mau Chung F. Chang, Thousand Oaks; Peter M. Asbeck, San Diego, both of Calif.

[73] Assignee: Rockwell International Corporation, Seal Beach, Calif.

[21] Appl. No.: 700,367

[22] Filed: May 13, 1991

[51] Int. Cl.$^5$ ............................................. H01L 29/72
[52] U.S. Cl. ................................ 257/198; 257/523; 257/563; 257/586; 257/575
[58] Field of Search ........................... 357/34, 16, 91; 257/198, 201, 523, 564, 586, 609, 615, 575, 574, 569

[56] References Cited
U.S. PATENT DOCUMENTS
4,939,562  7/1990  Adlerstein .......................... 357/16

FOREIGN PATENT DOCUMENTS
1-5063  1/1989  Japan ................................. 357/16

OTHER PUBLICATIONS

Sullivan et al, 'AlGaAs ... Heterojunction Bipolar ...', *Electronics Lttrs.*, vol. 22, No. 8, Apr. 10, 1986, pp. 419–421.
Cavanagh et al, 'Reduction of Collector–Emitter Leakage ...', *IBM Tech.*, vol. 25, No. 4, Sep. 1982, p. 1882.
Zohta et al, 'Shallow Donor ... Produced by Ion Implant ...', *Japan. J. Appl. Phys.*, vol. 10, 1971, pp. 532–533.

*Primary Examiner*—John B. Sotomayor
*Attorney, Agent, or Firm*—John J. Deinken

[57] ABSTRACT

A C-up HBT is made to operate in the microwave/millimeter frequency range by self-aligning the collector uprisers on the base relative to proton damaged emitter regions and the base contacts which minimizes carrier injection into the extrinsic base. The use of about 7–10% indium in the indium gallium arsenide base is sufficient to stop the FREON-12 etch at the base after totally etching through the collector and single self-aligning mask.

16 Claims, 3 Drawing Sheets

SELF-ALIGNED GALLIUM ARSENIDE/ALUMINUM GALLIUM ARSENIDE COLLECTOR-UP HETEROJUNCTION BIPOLAR TRANSISTORS CAPABLE OF MICROWAVE APPLICATIONS AND METHOD

This invention was made with Government support under

Contract No. N00014-86-C-0078 awarded by the Office of Naval

Research. The Government has certain rights in this invention.

BACKGROUND OF THE INVENTION

1. Field of the Invention

The field of the invention is collector-up, emitter-down HBTs capable of operating at microwave/millimeter frequencies.

2. Prior Art

The prior art is best represented by an article in IEEE Electron Device Letters, Vol. EDL-7, page 32, No. 1, Jan. 1986 by Sadao Adachi et al. entitled "Collector-UP HBTs Fabricated by Be+ and O+ Ion Implantations."

This article states that to successfully realize C-up HBTs, it is necessary to reduce parasitic current injection into the extrinsic base region. The authors apparently accomplish this by employing a high-resistivity layer buried in the extrinsic base-emitter junction region in order to block current injection from the emitter to the extrinsic base contact. This highly resistive layer buried in the extrinsic base-emitter junction region is formed by Be+/O+ implantations. The Be+ implantation was carried out to make contact to the P+ gallium arsenide base layer in the intrinsic base area adjoining the collector. The O+ implantation was also carried out with the same mask to enable the formation of a high resistivity layer in the N aluminum gallium arsenide emitter region underneath the P+ gallium arsenide base. In this way, parasitic current injection into the extrinsic base region is stated to be avoided.

However, this structure is not self-aligned, and there is no high frequency performance measured.

SUMMARY OF THE INVENTION

The present invention provides a self-aligned C-up device, which minimizes the parasitic carrier injection from the emitter into the base and meanwhile minimizes the base/collector junction capacitance and base resistance to maximize the maximum oscillation frequency ($f_{max}$) of the transistor. This result is produced by selectively proton damaging the emitter regions under the base at locations not covered by the collector towers or uprisers so that current flow is facilitated from the emitter through the base directly to the overlying collector uprisers. The base-collector area is less than the base-emitter area so the carrier injection from the emitter must be minimized or eliminated. In the NPN type, the base layer is P+ pseudomorphic InGaAs whereas the collector layer is N-GaAs. Selective RIE etching using FREON-12 ($CCl_2F_2$/He) plasma serves to etch the collector layer (about 6000Å thick) to stop at the base layer about 800-1000Å thick automatically due to the base material, the collector material. A common mask is utilized to form the collector, base contacts, and proton damaged regions in the emitter under the base between the collector uprisers. This self-aligned arrangement reduces the extrinsic base area and minimizes the base resistance. This same mask also allows the selective etching and the ion/proton damage to be carried out above and below the base area, respectively. The use of a $CCl_2F_2$/He plasma in reactive ion etching the thick gallium arsenide collector layer differentially from the indium gallium arsenide base results in stopping the etching within 10Å of the base layer. The carrier injection from the emitter to the base is greatly reduced by the proton damage step to select portions of the emitter region to provide excellent rf performance. This structure provides lower base/collector capacitance, lower emitter inductance and significantly better feedback isolation for operating at maximum frequencies of 105 GHz, or higher.

A PNP collector-up HBT can be made using the identical process by merely changing the doping of the collector layer to P− GaAs, the base layer to N+ InGaAs, and the emitter layer to P− AlGaAs.

DETAILED DESCRIPTION OF A PREFERRED EMBODIMENT OF THE INVENTION

Figure 1:
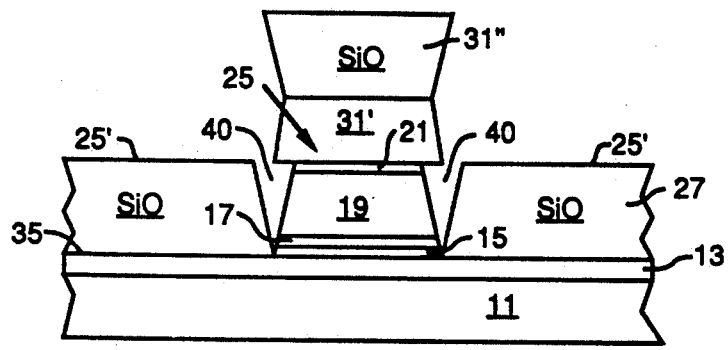
FIG. 1 incorporates several processing steps for defining a mesa for the fabrication of a C-up HBT.
Figure 1A:
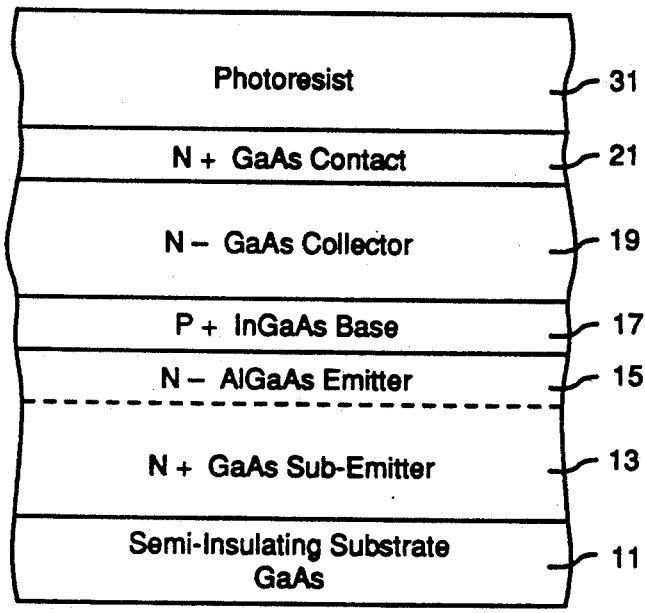
FIG. 1A shows the various materials laid down in proper order by MOCVD or MBE to comprise the mesa of FIG. 1.

Considering now both FIGS. 1 and 1A, it will be seen that the semi-insulating substrate 11, preferably gallium arsenide, forms the support for the layers to be deposited thereon. First, the sub-emitter 13 of gallium arsenide is deposited on substrate 11 using molecular beam epitaxy or metal oxide chemical vapor deposition conventional techniques and the sub-emitter may be doped as it is being deposited.

The emitter 15 is next deposited as aluminum gallium arsenide and doped N−. Aluminum is ramped to form the grading layer between GaAs and AlGaAs. The transition from GaAs to AlGaAs is gradual. The ramp may be deployed between the sub-emitter 13 and the emitter 15, in which case the thickness of the layers is about 2000Å for the emitter (i.e.), 400Å for the Al ramp-up (not shown) and 6300Å for the sub-emitter 13.

The next layer to be deposited and doped is the base 17 layer of indium gallium arsenide which is P+ doped.

It may have a thickness of approximately 1050Å of which 300Å may be devoted to a down ramp, including indium, to the emitter 15 with 50Å of setback thereover and 100Å on top of indium gallium arsenide as a ramp down for the base 17.

The next layer deposited is that of collector 19 which is of gallium arsenide that is N− doped. The collector measures about 6000Å in thickness, to provide good breakdown voltage, with 5000Å being the actual collector 19 and 1000Å being a super collector which is the N+ gallium arsenide contact or cap layer 21.

In general, the temperatures for growing the various layers are 610°-620° C. for sub-emitter 13, with an atomic concentration of 5E18, the emitter 15 is grown at 620° C. with a concentration of 3E17, and the base is grown at 550° C. with an atomic concentration of 2~10E19. The collector 19 and super collector 21 are grown at 550° C. with the atomic concentration in the collector being 1E18 and in the super collector 2E19.

Returning to FIG. 1 now, the mesa 25 represents the location of the transistor being grown comprising emitter 15, base 17, collector 19, and contact layer 21, which may be one of a large number of transistors grown at the same time on semi-insulating substrate 11.

It is therefore very desirable to have each of these transistors of the same height, and consequently, the upper surface 25' of the silicon monoxide 27 and the mesa 25 should be highly planar. This is because HBTs operating in higher frequency realms, and at higher power levels, require nearly perfect planar surfaces to prevent breakdown, minimize parasitics, and maintain operational integrity.

Recent U.S. Pat. No. 4,996,165 entitled "Self-Aligned Dielectric Assisted Planarization Process" to the same inventors, and assigned to a common assignee, issued Feb. 26, 1991, and discloses the best known way of planarizing surface 25'. This patent is incorporated by way of reference herein, but the steps leading to FIG. 1 will now be explained.

First, a layer of photoresist 31 (best seen in FIG. 1A) is deposited on layer 21 and developed and etched down to surface 35 to produce the pattern 31' of photoresist in FIG. 1 prior to applying SiO 27. Preferably, reactive ion etching is utilized because of the substantially vertical sidewalls it provides for the mesas, such as 25, during etching. Photoresist 31' is left in place to cover the upper portions or top of the features being formed in FIG. 1.

Next, a layer of dielectric material 27, preferably SiO is deposited on the etched surface 35 between the newly formed mesas 25. SiO is a preferred material due to its well understood etching rate and preferred material characteristics which are used in conjunction with the polymer processing described hereinafter. The dielectric material 27 is deposited to a depth which is substantially identical to the height of the mesas 25 which in the preferred applications are all the same height. Since the process used to etch the substantially uniform height mesas 14 is well known, and is controllable with high precision, the height of the mesas produced is easily determined. Preferably the SiO is deposited by evaporation which is highly compatible with desired applications for HBT transistors.

Once the SiO dielectric layer 27 has been deposited to the level 25', comparable to the height of mesa 25, the remaining photoresist, such as 31', is removed in conventional manner and the removal of photoresist 31' also removes SiO 31" deposited thereon.

This provides a reasonably planar surface 25' except for narrow "gaps" or "trenches" 40 (FIG. 1). These gaps are between the SiO 27 and the sidewalls of mesa 25. Due to masking and shadow effects normally encountered in photoresist etching, as well as in depositing material into finite depressions close to features covered by a layer of photoresist material, the SiO does not interface directly nor completely with the sides of the mesa 25 or similar features. This creates the series of small gaps 40 (shown exaggerated in size) which must be corrected.

Figure 2:
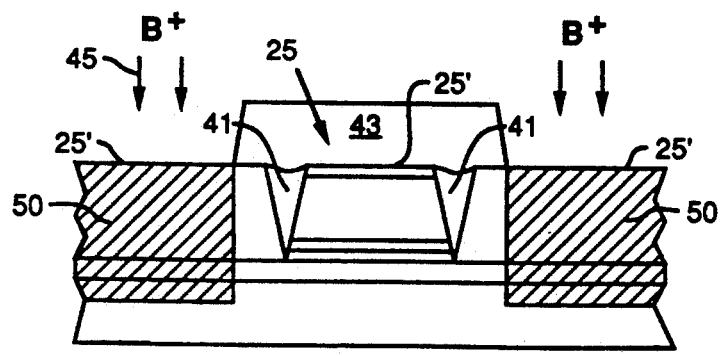
FIG. 2 illustrates the step of boron ion bombardment to establish isolation between the transistor being formed and others on the same wafer (not shown)

As shown in FIG. 2, a layer of polyimide is preferably deposited as a liquid on the surface 25' which is then coated and flows very uniformly over the surface and into the gaps 40. The excess polymer above the gaps 40 is removed preferably in a low pressure reactive ion etching process using oxygen plasma at a vertical inclination of about 0° or substantially perpendicular to the layer of polyimide. The RIE is employed because it provides selective etching of the polyimide and does not etch the SiO or mesa materials. The reactive ion etching also results in low re-polymerization in the processing chamber. Further materials may now be deposited on the planar surface 25'.

The surface 25' is planar to within about 200Å or less. Such a high degree of isoplanar refinement now allows greatly improved yield and device integrity with improved inter-level density.

After the gaps 40 are filled as shown at 41, a larger pattern of photoresist 43 is deposited over the mesa 25' and extends laterally thereof on both sides. This photoresist serves as a mask for boron ions, following the arrows 45 to effect the cross-hatched isolation 50 on either side of the device being formed.

Figure 3:
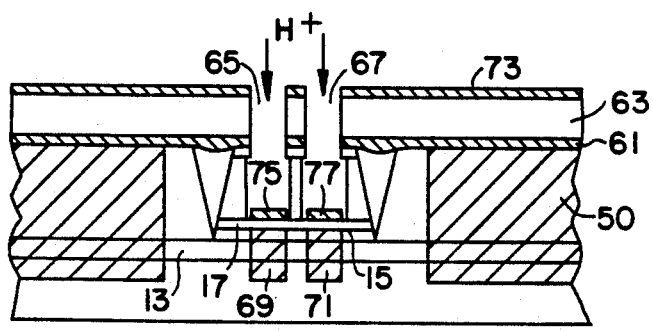
FIG. 3 uses a common photoresist mask to define the collector outline on the base, provide collector contact metal, establish the proton damage in the emitter and self-align the deposited base contacts to the collector; and proton damaged regions.

In FIG. 3, several important steps are shown. First, the photoresist 43 of FIG. 2 is removed and an interconnect layer of tungsten 61 is applied to surface 25'. A masking layer of photoresist 63 is then deposited over the tungsten layer 61.

Next, a mask (not shown) is placed over the photoresist 63 to define the top entrance to the passageways 65 and 67 which will be opened up by $CCl_2F_2$/He plasma. The purpose of this plasma is to open passageways 65 and 67 through the photoresist 63 and the isolation SiO 50 and to be stopped by the approximately 800Å thick base 17 of pseudomorphic indium gallium arsenide. It has been found that approximately 7-10% indium is sufficient for the "stop" function.

It has been found that when hydrogen ions are utilized, an ion generator at 40 to 60 Kev causes the regions 69 and 71 to expand outwardly, relative to the contact regions 75 and 77, in order that the regions between collector columns 81-83 and 83-85 (FIG. 5) are completely blocked to emitter carriers into the base 17.

Also, in FIG. 3, the separation distance between the deposited base material 75, 77 and the active emitter 15 is controlled by the degree of undercut during the etchdown to base layer 17. Preferably, this distance is less than 0.2 micrometers to minimize base resistance.

The next step in FIG. 3 is the step of proton damage to cause the damaged regions 69 and 71 which adversely effect the emitter layer 15.

The next step in FIG. 3 is the deposit of the base contact material, which is a non-alloyed refractory titanium/platinum material 73. It will be seen that the refractory material makes the base contacts 75 and 77.

Figure 4:
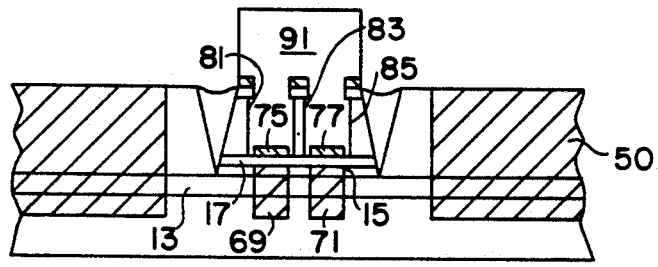
FIG. 4 removes extra metal or contact material, and establishes photoresist over the active region.

In FIG. 4, the unused refractory material 73 is removed, the photoresist 63 is removed, and the tungsten 61 is removed except in the vicinity of the collector towers or uprisers 81, 83, and 85. Photoresist 91 is applied to cover the active region, including the collector towers 81, 83, and 85.

Figure 5:
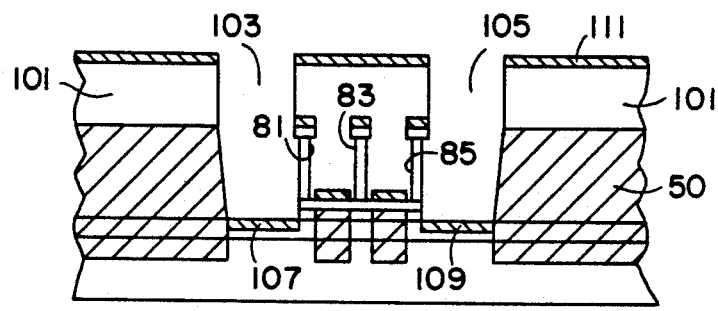
FIG. 5 provides for etching the collector to final shape and establishes the emitter contacts.

In FIG. 5, a new layer of photoresist 101 is laid down over the silicon monoxide 50, and an emitter contact mask (not shown) is placed over the photoresist 101 to open the regions 103 and 105 adjacent to collector uprisers 81 and 85, being wide enough for the emitter contacts 107 and 109. After these openings are made, AuGe/Ni 111 is evaporated onto the top surface of photoresist 101 and enters the cutouts 103 and 105 to form emitter contacts 107 and 109 which are deposited in the sub-emitter layer 13.

Figure 6:
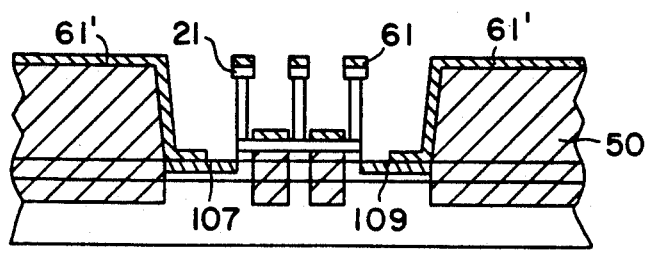
FIG. 6 shows the final device with metal interconnects provided.

In FIG. 6, AuGe/Ni layer 111 and photoresist 101 have been removed and replaced with enough photoresist (not shown) to cover the active region and a portion of the emitter contacts 107, 109 in order that the emitter contacts may be brought out as first metal 61' on either side of the active region.

Figure 7:
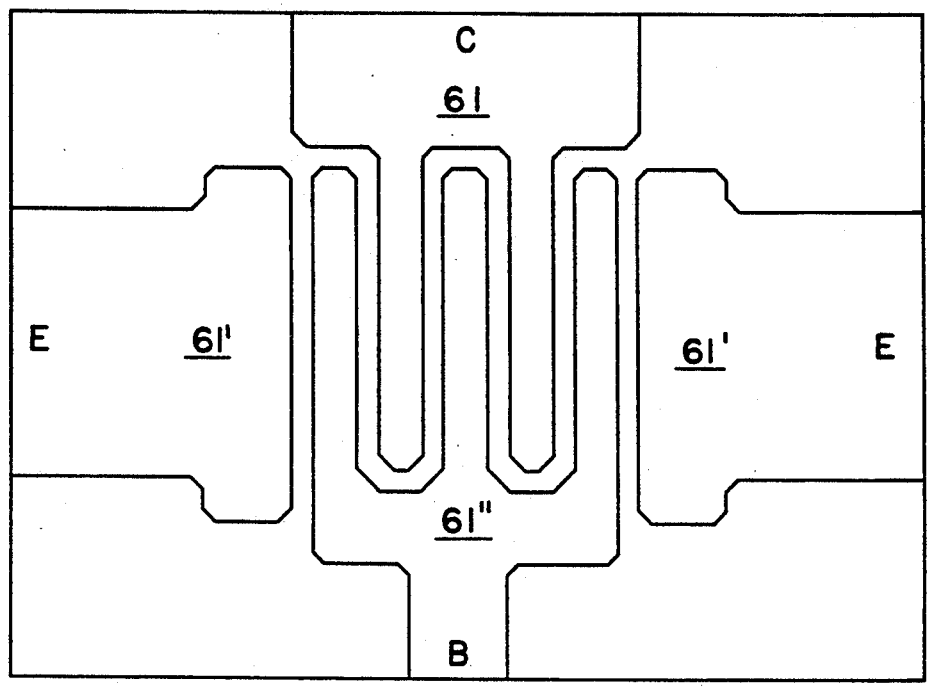
FIG. 7 is a view in plan of the alternate embodiment of the invention shown in FIG. 8 and also shows the device of FIG. 6 in plan when the base and collector notations of FIG. 7 are interchanged; and, FIG. 8 shows a two-upriser collector with a three-prong base and indicates the proton damaged regions in the emitter where the base is not covered by collector uprisers.
Figure 8:
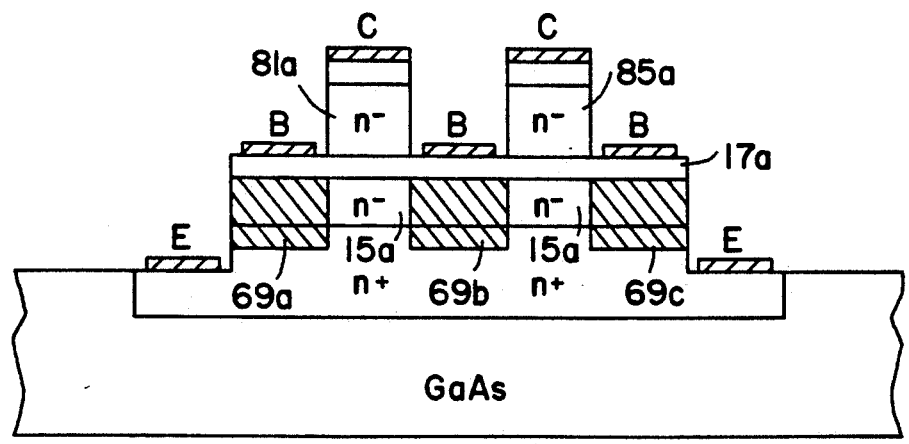

An alternative embodiment is shown in FIGS. 7 and 8 simply to provide three base contacts and two collector uprisers, both in oval shaped forms extending into the paper as shown at 61 and 61'' in FIG. 7.

FIG. 7 may be viewed as the plan view for FIG. 6 providing the lower base is considered as the three pronged upper collector uprisers 81, 83, 85 of FIG. 6 and the upper collector of FIG. 7 is considered as the two contact (75 77) base of FIG. 6.

FIG. 7 is the plan view of the structure as shown in FIG. 8, which is manufactured in accordance with the steps described in connection with FIGS. 1-6, using the same materials.

The difference is that the N− gallium arsenide collectors 81a and 85a do not cover as much of the base 17a as in the previous example. Thus, the effective emitter areas are shown at 15a, and the remainder of the emitter is proton damaged as shown at 69a, 69b, and 69c. Thus, the result is the same because the emitter current is blocked outside of the areas where the current has direct access to the collectors 81a and 85a.

To make the PNP version, the only changes necessary may be best seen with reference to FIG. 1A wherein:

contact layer 21 becomes P+ GaAs
collector layer 19 becomes P− GaAs
base layer 17 becomes N+ InGaAs
emitter layer 15 becomes P− AlGaAs, and
the sub emitter layer 13 becomes P+ GaAs.

In summary, self-aligned C-up HBTs have lower base/collector capacitance, lower emitter inductance, low emitter and base resistance due to self-alignment base/collector, also space can be minimized (about 0.2~0.3 micron), and significantly better feedback isolation than conventional E-up HBTs. These characteristics enable operation in the microwave/millimeter frequencies. Based on simulation of a fitted T-equivalent circuit model, $f_{max}$ of 300 GHz can be anticipated for future C-up HBTs with a collector width scaled down to 1 micron. Collector widths down to 2.6 microns with base doping up to 1E20 $cm^3$ have been used. Based on s-parameters measured up to 26 GHz, an extrapolated current gain bandwidth, $f_t$, of 65 GHz and a maximum frequency of oscillation, $f_{max}$, of 102 GHz have been obtained.

What is claimed is:

1. A self-aligned collector-up heterojunction bipolar transistor, comprising in combination:
   a base of indium gallium arsenide which is P doped;
   a collector, in contact with the base, of gallium arsenide which is N− doped;
   an emitter, also in contact with the base, of aluminum gallium arsenide which is N doped; and,
   contacts to the base, collector and emitter.

2. The transistor of claim 1, wherein:
   the base is a planar layer;
   the emitter is a layer beneath the base;
   the collector comprises spaced apart uprisers supported by the base layer; and,
   proton damaged regions in the emitter beneath the spacings between collector uprisers to reduce emitter injected base current.

3. The transistor of claim 2, further comprising:
   proton damaged regions in the emitter extending to the base wherever the base is not covered by the collector uprisers; and,
   said base contact is self-aligned to the collector uprisers whereby the spacing between collector contact/base contact is minimized, which provides minimum base series resistance and base emitter capacitance.

4. The transistor of claim 3, wherein:
   the collector uprisers are spaced apart fingers; and,
   the base contacts are spaced apart fingers interlaced with the upriser fingers.

5. The transistor of claim 1, wherein:
   the base is a planar layer;
   the emitter is a layer beneath the base;
   the collector comprises spaced apart uprisers supported by the base layer; and,
   proton damage regions in the emitter extending to the base wherever the base is not covered by the collector uprises.

6. The transistor of claim 5, wherein:
   said emitter contacts are deployed outboard of the base.

7. The transistor of claim 6, wherein:
   said base contacts are deployed in between the collector uprisers.

8. The transistor of claim 6, wherein:
   said base contacts are deployed on both sides of each collector upriser.

9. A self-aligned collector-up heterojunction bipolar transistor, comprising in combination:
   a base of indium gallium arsenide which is N doped;
   a collector, in contact with the base, of gallium arsenide which is P doped;
   an emitter, also in contact with the base, of aluminum gallium arsenide which is P doped; and,
   contacts to the base, collector and emitter.

10. The transistor of claim 9, wherein:
    the base is a planar layer;
    the emitter is a layer beneath the base;
    the collector comprises spaced apart uprisers supported by the base layer; and,
    proton damaged regions in the emitter beneath the spacings between collector uprisers to reduce emitter injected base current.

11. The transistor of claim 10, further comprising:
    proton damaged regions in the emitter extending to the base wherever the base is not covered by the collector uprisers; and,
    said base contact is self-aligned to the collector uprisers whereby the spacing between collector contact/base contact is minimized, which provides minimum base series resistance and base emitter capacitance.

12. The transistor of claim 11, wherein:
the collector uprisers are spaced apart fingers; and,
the base contacts are spaced apart fingers interlaced with the upriser fingers.

13. The transistor of claim 9, wherein:
the base is a planar layer;
the emitter is a layer beneath the base;
the collector comprises spaced apart uprisers supported by the base layer; and,
proton damage regions in the emitter extending to the base wherever the base is not covered by the collector uprisers.

14. The transistor of claim 13, wherein:
said emitter contacts are deployed outboard of the base.

15. The transistor of claim 14, wherein:
said base contacts are deployed in between the collector uprisers.

16. The transistor of claim 14, wherein:
said base contacts are deployed on both sides of each collector upriser.

* * * * *